United States Patent
Yano et al.

(10) Patent No.: US 7,026,788 B2
(45) Date of Patent: Apr. 11, 2006

(54) BATTERY LEAKAGE DETECTION CIRCUIT FOR ELECTRIC VEHICLE AND LEAKAGE DETECTION METHOD FOR ELECTRIC VEHICLE

(75) Inventors: Junya Yano, Kasai (JP); Takeshi Osawa, Takasago (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/137,410

(22) Filed: May 26, 2005

(65) Prior Publication Data

US 2005/0264264 A1   Dec. 1, 2005

(30) Foreign Application Priority Data

May 28, 2004   (JP) .............................. 2004-160344

(51) Int. Cl.
*H02J 7/00* (2006.01)
(52) U.S. Cl. ..................................................... 320/104
(58) Field of Classification Search ................ 320/104; 324/500, 522, 525
See application file for complete search history.

(56) References Cited

U.S. PATENT DOCUMENTS

| | | | | |
|---|---|---|---|---|
| 4,417,202 A | * | 11/1983 | Pascoe | 324/509 |
| 4,929,901 A | * | 5/1990 | Kimball et al. | 324/529 |
| 5,481,194 A | * | 1/1996 | Schantz et al. | 324/522 |
| 6,731,116 B1 | * | 5/2004 | Yamamoto et al. | 324/522 |

FOREIGN PATENT DOCUMENTS

| DE | 2809596 | * | 9/1979 |
|---|---|---|---|
| JP | 2003-169401 | | 6/2003 |

* cited by examiner

Primary Examiner—Pia Tibbits
(74) Attorney, Agent, or Firm—Wenderoth, Lind & Ponack, L.L.P.

(57) ABSTRACT

The present provides a leakage detection circuit for an electric vehicle, and so on, capable of calculating a leakage resistance. The leakage detection circuit for an electric vehicle detects a current $I_{g11}(t_1)$ that flows in leakage resistances $R_a$ and $R_b$ when one leakage detection switch $SW_1$ is closed at $t_1$ and the other leakage detection switch $SW_2$ is opened, and detects a current $I_{g12}(t_2)$ when the switch $SW_1$ is opened at $t_2$ and the switch $SW_2$ is closed. In addition, the circuit detects voltages $V_{l11}(t_1, t_2)$ and $V_{l12}(t_1, t_2)$ of portions where these leakage detection resistances $R_a$ are connected. A combined value $R_l$ of the leakage resistances is calculated by a leakage calculator based on the following equation 34

$$R_l = \frac{R_a}{\dfrac{V_{l12}(t_2)}{V_{g11}(t_2) - V_{g12}(t_2)} - \dfrac{V_{l11}(t_1)}{V_{g11}(t_1) - V_{g12}(t_1)}} - (R_a + R_b). \quad \text{Equation 34}$$

8 Claims, 4 Drawing Sheets

BATTERY LEAKAGE DETECTION CIRCUIT FOR ELECTRIC VEHICLE AND LEAKAGE DETECTION METHOD FOR ELECTRIC VEHICLE

BACKGROUND OF THE INVENTION

1. Technical Field

The present invention relates to a circuit and method for detecting leakage mainly of a charging/discharging circuit of a rechargeable battery, and particularly to a circuit and method for detecting leakage of a power supply device that drives motor for running an electric vehicle, such as hybrid car and electric car, for example.

2. Description of Related Art

High voltage is required to increase the output of a power supply device for running an electric vehicle. The reason is that output is proportional to the product of voltage and current. For example, the output voltage of a power supply device for running a hybrid car or an electric car is very high voltage of 200 V or more. Since, in a high-voltage power supply device, leakage causes a serious adverse effect, the device is not connected to a ground in consideration of safety. In order to prevent leakage, it is necessary for the power supply device that is not connected to a ground to detect a leakage resistance. The leakage resistance is a resistance between the power supply device and a ground. FIG. 4 corresponds to FIG. 1 in Japanese Patent Laid-Open Publication TOKUKAI No. 2003-169401, and shows a detection circuit for detecting the leakage resistance of a power supply device. A leakage detection circuit 50 shown in this Figure has a leakage detection resistance 51, a leakage detection switch 52, and a voltage detection circuit 53 that detects the voltage produced in the leakage detection resistance 51. When a leakage resistance Rr exists, in the state the leakage detection switch 52 is ON, a current flows in the leakage detection resistance 51. Accordingly, the voltage of the leakage detection resistance 51 is detected, thus, leakage can be detected.

However, it is difficult for this type of conventional leakage detection circuit to accurately calculate the leakage resistance value.

SUMMARY OF THE INVENTION

The present is devised to solve the above problems in this type of conventional circuit, and, therefore, is aimed to at providing a leakage detection circuit for an electric vehicle and leakage detection method for an electric vehicle capable of calculating a leakage resistance more easily and accurately.

To achieve the above object, a leakage detection circuit for an electric vehicle of the present invention is a battery leakage detection circuit for an electric vehicle comprising a battery pack including a plurality of batteries that are connected to each other in series; leakage detection resistances $R_a$ and $R_b$ that are connected in series between a ground, and each of battery terminals of the batteries at two arbitrary locations in the high and low voltage sides; voltage detecting means that detects voltages of the battery terminals in the high and low voltage sides as $V_{g11}(t)$ and $V_{g12}(t)$, respectively, at timing t; leakage detection switches $SW_1$ and $SW_2$ each of which is connected in series between the leakage detection resistances $R_a$ and $R_b$; and a voltage detector that detects a voltage $V_{l11}(t)$ produced in the leakage detection resistance $R_a$ connected to the leakage detection switch $SW_1$, when one leakage detection switch $SW_1$ connected to the battery terminal in the high voltage side is closed at timing t and the other leakage detection switch $SW_2$ is opened, and detects a voltage $V_{l12}(t)$ produced in the leakage detection resistance $R_a$ connected to the leakage detection switch $SW_2$, when the other leakage detection switch $SW_2$ connected to the battery terminal in the low voltage side is closed at timing t and the one leakage detection switch $SW_1$ is opened. The circuit further comprises a leakage calculator that calculates a combined value $R_l$ of the leakage resistances based on the following equation 5

$$R_l = \frac{R_a}{\frac{V_{l12}(t_2)}{V_{g11}(t_2) - V_{g12}(t_2)} - \frac{V_{l11}(t_1)}{V_{g11}(t_1) - V_{g12}(t_1)}} - (R_a + R_b) \quad \text{Equation 5}$$

where $t_1$ and $t_2$ are different time values. According to this construction, it is possible to easily obtain a leakage resistance value, and to calculate a leakage resistance value of the whole circuit even if leakage occurs at two or more locations.

In addition, a leakage detection circuits for electric vehicles of another aspect of the present invention further comprises a measurer that measures a terminal voltage $V_T(t)$ between the both ends of the battery pack at timing t, and in the case where leakage occurs at one of the locations, at timing t, where $V_f(t)$ is the voltage of the battery terminal in which the leakage occurs, and this voltage is represented by $K_l V_T(t)$ by using the terminal voltage $V_T(t)$ and a proportionality constant $K_l$, the leakage calculator calculates $k_l$ based on the following equation 6 and estimates the leakage portion based on $k_l$ $$k_l = \frac{\frac{V_{l11}(t_1)}{R_a}(R_l + R_a + R_b) + V_{g11}(t_1)}{V_T(t_1)} \quad \text{Equation 6}$$

$$0 \le k_l \le 1$$

According to this construction, it is possible to detect not only a leakage resistance value, but a leakage portion.

Furthermore, a leakage detection methods for an electric vehicle of another aspect of the present invention is a leakage detection method for an electric vehicle that detects leakage of a battery pack for the electric vehicle comprising steps of in a battery leakage detection circuit including leakage detection resistances $R_a$ and $R_b$, the leakage detection resistances $R_a$ and $R_b$ being connected in series between a ground, and each of battery terminals of the batteries that are connected to each other in series at two arbitrary locations in the high and low voltage sides in a plurality of batteries composing the battery pack, and leakage detection switches $SW_1$ and $SW_2$ each of which is connected in series between the leakage detection resistances $R_a$ and $R_b$, detecting a voltage $V_{l11}(t)$ produced in the leakage detection resistance $R_a$, when one leakage detection switch SW, connected to the battery terminal in the high voltage side is closed at timing t and the other leakage detection switch $SW_2$ is opened; detecting a voltage $V_{l12}(t)$ produced in the leakage detection resistance $R_a$, when the other leakage detection switch $SW_2$ connected to the battery terminal in the low voltage side is closed at timing t and the one leakage detection switch $SW_1$ is opened, detecting voltages of the battery terminals in the high and low voltage sides as $V_{g11}(t)$ and $V_{g12}(t)$, respectively; and calculating a combined value $R_l$ of the leakage detection resistances by using the values detected in the foregoing steps based on the following equation 7

$$R_l = \frac{R_a}{\frac{V_{ll2}(t_2)}{V_{g11}(t_2) - V_{g12}(t_2)} - \frac{V_{ll1}(t_1)}{V_{g11}(t_1) - V_{g12}(t_1)}} - (R_a + R_b) \quad \text{Equation 7}$$

where $t_1$ and $t_2$ are different time values. According to this method, it is possible to easily obtain a leakage resistance value, and to calculate a leakage resistance value of the whole circuit even if leakage occurs at two or more locations, In addition, a leakage detection method for electric vehicles of another aspect of the present invention further comprises steps of measuring a terminal voltage $V_T(t)$ between the both ends of the battery pack at timing t, and estimating, in the case where leakage occurs at one of the locations, at timing t, where $V_l(t)$ is the voltage of the battery terminal in which the leakage occurs and this voltage is represented by $K_l V_T(t)$ by using the terminal voltage $V_T(t)$ and a proportionality constant $K_l$, the leakage portion based on $k_l$ by calculating $k_l$ based on the following equation 8

$$k_l = \frac{\frac{V_{ll1}(t_1)}{R_a}(R_l + R_a + R_b) + V_{g11}(t_1)}{V_T(t_1)} \quad \text{Equation 8}$$

$$0 \le k_l \le 1$$

According to this method, it is possible to detect not only a leakage resistance value, but to determine a leakage portion.

The leakage detection circuit for an electric vehicle and the leakage detection method for an electric vehicle of the present invention can calculate information about leakage based on the particular equation. In addition, since it is not necessary to attach a special device thereto, they are easily applied to existing facilities. Therefore, it is possible to detect the leakage resistance value, the leakage portion, and so on, and, thus, to, quickly take necessary measures. This can provide safety use of electric vehicles.

DETAILED DESCRIPTION OF THE PREFERRED EMBODIMENT

Figure 1:
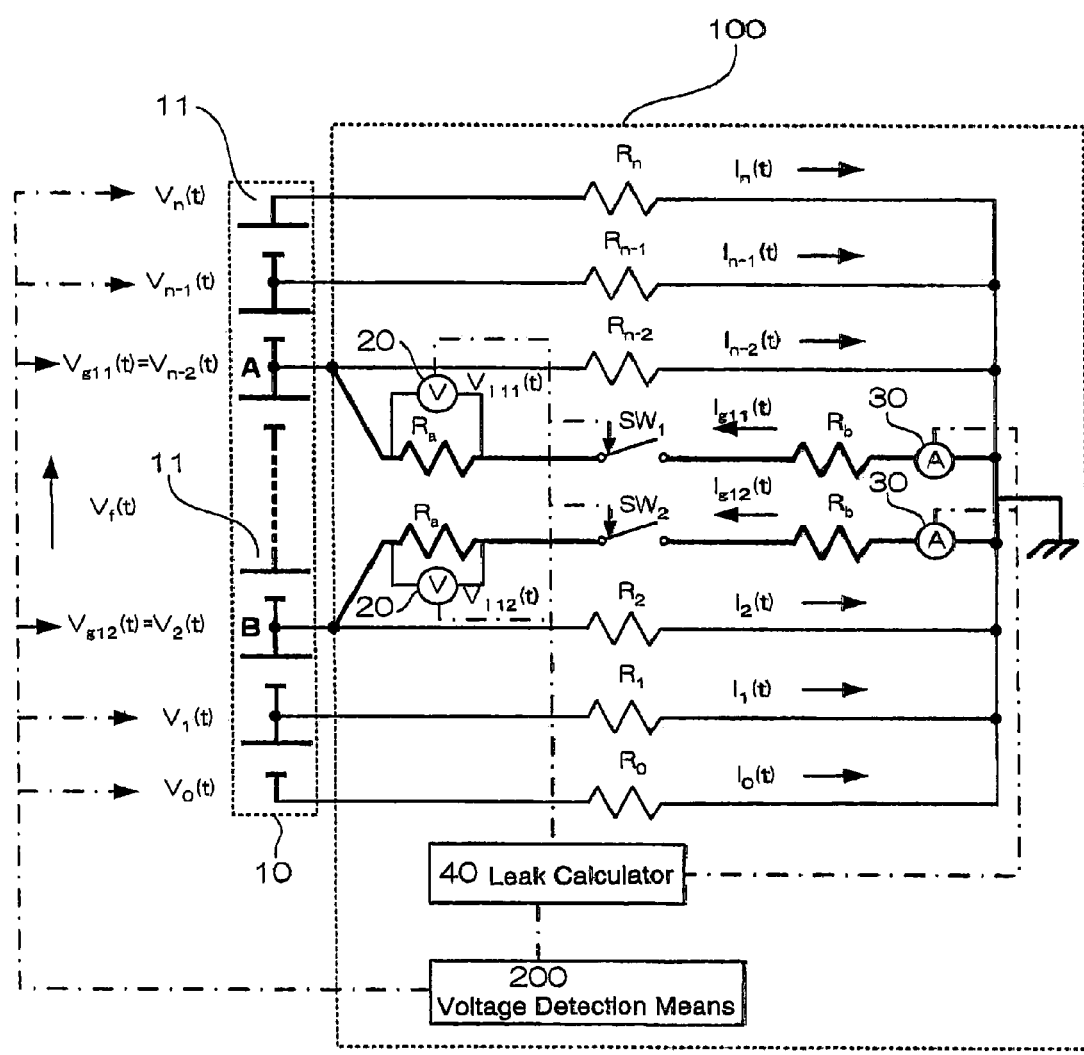
FIG. 1 is a circuit diagram showing a leakage detection circuit for an electric vehicle according to one embodiment of the present invention.

The following description will describe an embodiment according to the present invention with reference to the drawings. It should be appreciated, however, that the embodiment described below is illustrations of a leakage detection circuit for an electric vehicle and a leakage detection method for an electric vehicle to give a concrete form to technical ideas of the invention, and a leakage detection circuit for an electric vehicle and a leakage detection method for an electric vehicle of the invention are not specifically limited to description below. Furthermore, it should be appreciated that the members shown in claims attached hereto are not specifically limited to members in the embodiment. Unless otherwise specified, any dimensions, materials, shapes and relative arrangements of the parts described in the embodiment are given as an example and not as a limitation. Additionally, the sizes and the arrangement relationships of the members in each of drawings are occasionally shown larger exaggeratingly for ease of explanation. Members same as or similar to those of this invention are attached with the same designation and the same reference numerals and their description is omitted. In addition, a plurality of structural elements of the present invention may be configured as a single part which serves the purpose of a plurality of elements, on the other hand, a single structural element may be configured as a plurality of parts which serve the purpose of a single element.

FIG. 1 shows an example of leakage detection circuit for an electric vehicle according to one embodiment of the present invention. A leakage detection circuit for an electric vehicle 100 shown in this Figure is added to a battery pack 10 including n batteries 11 connected to each other in series. For ease of explanation, a circuit for charging/discharging the battery pack 10 is not illustrated. The battery 11 is shown as a unit cell in the Figure, but may include a plurality of cells connected to each other in series or in parallel.

This leakage detection circuit for an electric vehicle 100 includes a voltage detection means 200 that can detect respective voltages $V_{0-n}$ in terminal locations of batteries 11 at prescribed timing. Voltages detected by the voltage detection means 200 at time t are $V_{0-n}(t)$. In this embodiment, $V_0(t)$, $V_1(t)$, $V_2(t)$, ..., $V_{n-1}(t)$, and $V_n(t)$ are potentials relative to $V_0(t)$, if leakage occurs in any of the batteries 11, electric currents flow from the respective terminal of the leaked batteries 11 to a ground. Accordingly, a circuit in which the terminal of each battery 11 connected to a ground (in this case, chassis of vehicle) via each of leakage resistances $R_{0-n}$ serves as an equivalent circuit of leakage. In addition, it is assumed that currents $I_{0-n}$ flow the leakage resistances $R_{0-n}$, respectively. Currents detected by a current detector at time t are $I_{0-n}(t)$. In FIG. 1, $I_{0-n}(t_1, t_2)$ represent $I_{0-n}(t_1)$ or $I_{0-n}(t_2)$ A leakage detection resistance $R_a$, a leakage detection switch $SW_1$ or $SW_2$, and a leakage detection resistance $R_b$ are connected in series between each of two terminals A and B at arbitrary locations in the high and low voltage sides and a ground. The battery terminals A and B may be both ends of the battery pack 10. The resistance values of leakage detection resistances $R_a$ and $R_b$ connected to the points A and B equal to each other. The leakage detection switches $SW_1$ and $SW_2$ can be opened and closed at individual timing. In the illustration of FIG. 1, $I_{g11}(t_1)$ is a current that flows in the leakage detection resistances $R_a$ and $R_b$ when the leakage detection switch $SW_1$ connected to the point A is closed at timing $t_1$, while $I_{g11}(t_2)$ is a current that flows in the leakage detection resistances $R_a$ and $R_b$ when it is closed at timing $t_2$. In addition, $I_{g12}(t_1)$ is a current that flows in the leakage detection resistances $R_a$ and $R_b$ when the leakage detection switch $SW_2$ connected to the point B is closed at timing $t_1$, while $I_{g12}(t_2)$ is a current that flows in the leakage detection resistances $R_a$ and $R_b$ when it is closed at timing $t_2$. In this case, the currents are detected by current detectors 30.

Additionally, $V_{f11}(t_1)$, $V_{f11}(t_2)$, $V_{f12}(t_1)$, and $V_{f12}(t_2)$ are voltages at the points A and B detected by voltage detectors 20 at timing $t_1$ and $t_2$, respectively. Where R is a combined resistance of the leakage detection resistances $R_a$ and $R_b$, and $V_f(t_1, t_2)$ is the voltage between A and B, the following equations 9 are formulated.

$$R = R_a + R_b$$

$$V_{f11}(t_1) = R_a \cdot I_{g11}(t_1)$$

$$V_{f12}(t_2) = R_a \cdot I_{g12}(t_2)$$

$$V_f(t_1) = V_{g11}(t_1) - V_{g12}(t_1)$$

$$V_f(t_2) = V_{g11}(t_2) - V_{g12}(t_2) \qquad \text{Equations 9}$$

In this case, $V_{g11}(t)$ is the voltage ($V_{n-2}(t)$ in FIG. 1) in the aforementioned battery terminal B, while $V_{g12}(t)$ is the voltage ($V_2(t)$ in FIG. 1) in the aforementioned battery terminal A. As discussed later, when the above equations are applied, the leakage resistance value $R_l$ of FIG. 1 can be represented by the following equation 10.

$$R_l = \left(\sum_{i=0}^{n} \frac{1}{R_i}\right)^{-1} = \frac{R_a}{\frac{V_{f12}(t_2)}{V_f(t_2)} - \frac{V_{f11}(t_1)}{V_f(t_1)}} - R \qquad \text{Equation 10}$$

The leakage detection circuit for an electric vehicle of FIG. 1 further includes a leakage calculator 40 that detects leakage and calculates a leakage resistance or detects a leakage portion. The leakage calculator 40 can be configured by hardware of gate arrays (FPGA, ASIC, and so on) or by software. The circuit may have a display portion that can display the leakage resistance value, the leakage portion, and so on, as a calculation result. A 7-segment display with LEDs, an LCD monitor, or the like, can be used as the display portion.

Figure 2:
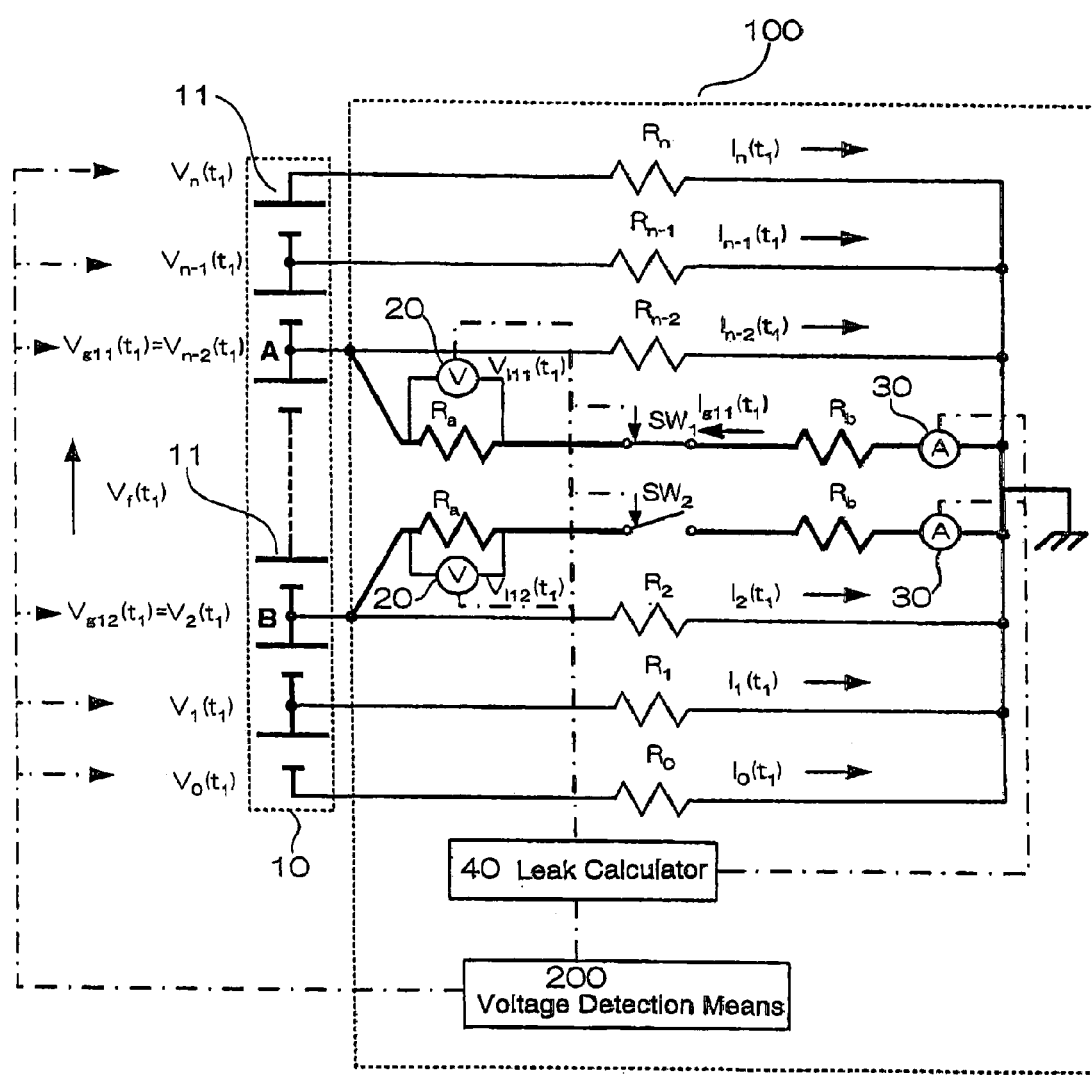
FIG. 2 is a circuit diagram showing operation in the circuit of FIG. 1 at time $t_1$.

The procedure formulating the foregoing equations is now described. First, at time $t_1$, as shown in FIG. 2, when the leakage detection switch $SW_2$ is opened and the leakage detection switch $SW_1$ is closed, a total of the leakage currents is $I_{g11}(t_1)$ that flows in the leakage detection resistance $R_a$ connected to the point A. Accordingly, $I_{g11}(t_1)$ is represented by the following equation 11.

$$I_{g11}(t_1) = I_n(t_1) + I_{n-1}(t_1) + I_{n-2}(t_1) + I_2(t_1) + t_1) + I_0(t_1) \qquad \text{Equation 11}$$

On the other hand, a current $I_n(t_1)$ that flows in the leakage resistance $R_n$ can be obtained by the following equation 12. Where $R = R_a + R_b$ as discussed above.

$$I_n(t_1) = \frac{\{V_n(t_1) - V_o(t_1)\} - \{(V_{g11}(t_1) - V_o(t_1)) + RI_{g11}(t_1)\}}{R_n} = \qquad \text{Equation 12}$$

$$\frac{V_n(t_1) - (V_{g11}(t_1) + RI_{g11}(t_1))}{R_n}$$

$I_{g11}(t_1)$ can be represented by the following equation 13 by applying the foregoing equations 11 and 12.

$$I_{g11}(t_1) = \frac{V_n(t_1) - (V_{g11}(t_1) + RI_{g11}(t_1))}{R_n} + \qquad \text{Equation 13}$$

$$\frac{V_{n-1}(t_1) - (V_{g11}(t_1) + RI_{g11}(t_1))}{R_{n-1}} +$$

-continued $$\frac{V_{n-2}(t_1) - (V_{g11}(t_1) + RI_{g11}(t_1))}{R_{n-2}} + \ldots +$$

$$\frac{V_2(t_1) - (V_{g11}(t_1) + RI_{g11}(t_1))}{R_2} +$$

$$\frac{V_1(t_1) - (V_{g11}(t_1) + RI_{g11}(t_1))}{R_1} +$$

$$\frac{V_o(t_1) - (V_{g11}(t_1) + RI_{g11}(t_1))}{R_o}$$

As a result, the foregoing equation 13 is transformed, thus, $I_{g11}(t_1)$ can be represented by the following equation 14.

$$I_{g11}(t_1) = \sum_{i=0}^{n} \frac{V_i(t_1)}{R_i} - V_{g11}(t_1) \sum_{i=0}^{n} \frac{1}{R_i} - RI_{g11}(t_1) = \sum_{i=0}^{n} \frac{1}{R_i} \qquad \text{Equation 14}$$

Figure 3:
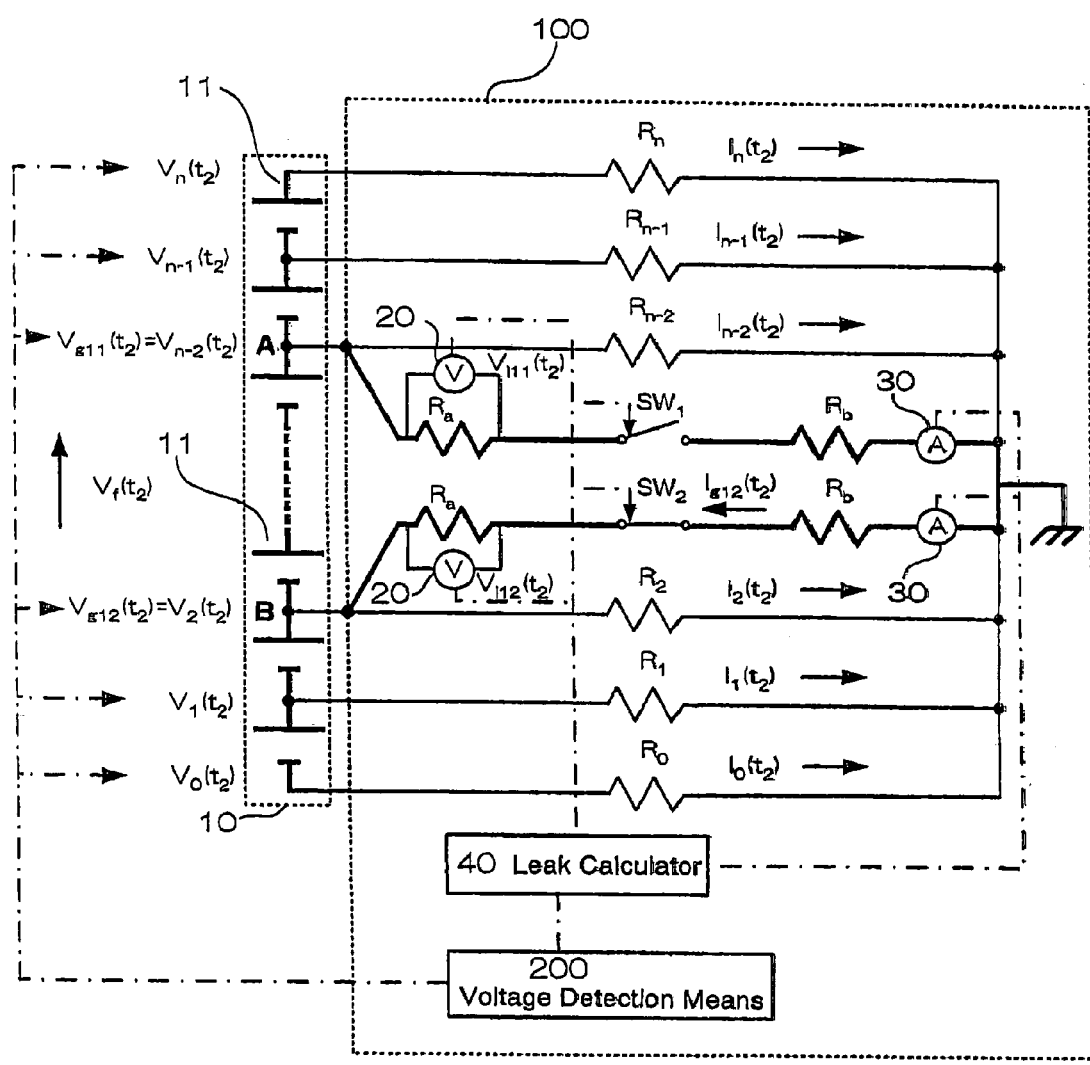
FIG. 3 is a circuit diagram showing operation in the circuit of FIG. 1 at time $t_2$.
Figure 4:
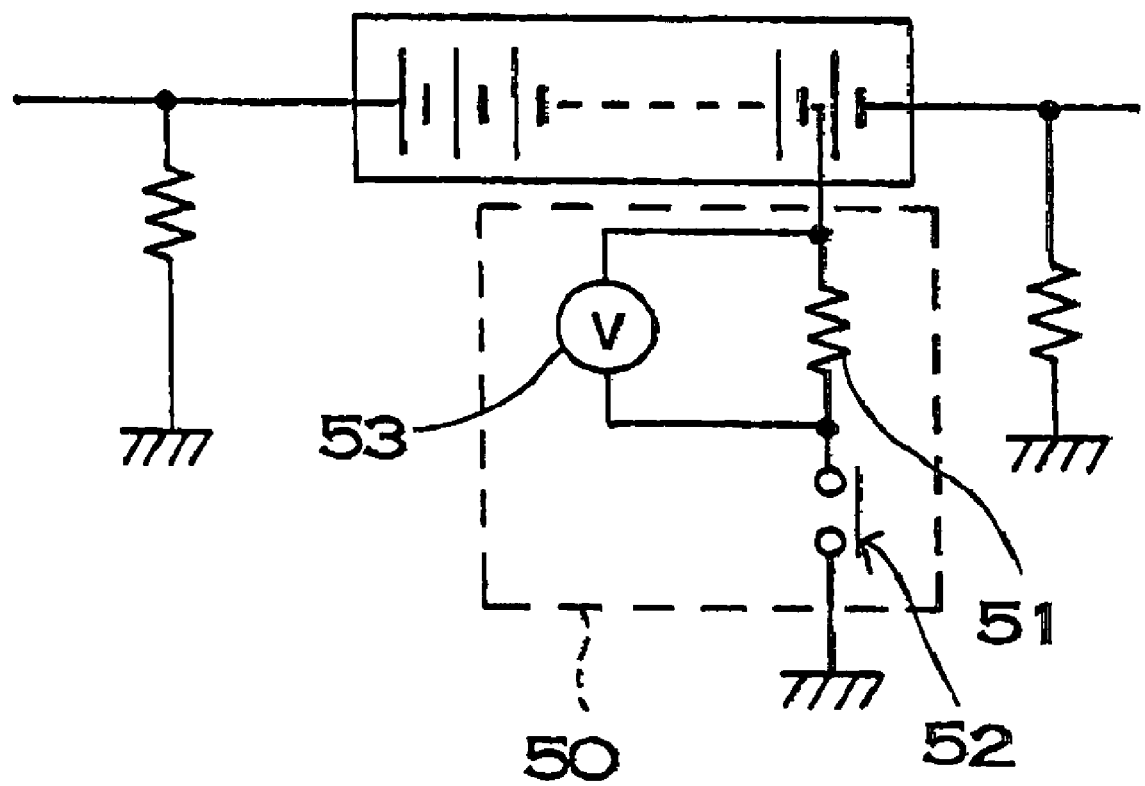
FIG. 4 is a conventional circuit diagram showing a leakage detection circuit for an electric vehicle.

On the other hand, at time $t_2$, as shown in FIG. 3, when the leakage detection switch $SW_1$ is opened and the leakage detection switch $SW_2$ is closed, a total of the leakage currents is $I_{g12}(t_2)$ that flows in the leakage detection resistance $R_a$ connected to the point B. Accordingly, $I_{g12}(t_2)$ is represented by the following equation 15.

$$I_{g12}(t_2) = I_n(t_2) + I_{n-1}(t_2) + I_{n-2}(t_2) + \ldots + I_2(t_2) + I_1(t_2) + I_0(t_2) \qquad \text{Equation 15}$$

As discussed above, based on a current $I(t_2)$ that flows in the leakage resistance $R_n$, the foregoing equation 15 is transformed to the following equation 16.

$$I_{g12}(t_2) = \frac{V_n(t_2) - (V_{g12}(t_2) + RI_{g12}(t_2))}{R_n} + \qquad \text{Equation 16}$$

$$\frac{V_{n-1}(t_2) - (V_{g12}(t_2) + RI_{g12}(t_2))}{R_{n-1}} + \ldots +$$

$$\frac{V_1(t_2) - (V_{g12}(t_2) + RI_{g12}(t_2))}{R_1} +$$

$$\frac{V_0(t_2) - (V_{g12}(t_2) + RI_{g12}(t_2))}{R_o}$$

As a result, the foregoing equation 16 is transformed, thus, the current $I_{g12}(t_2)$ can be represented by the following equation 17.

$$I_{g12}(t_2) = \sum_{i=0}^{n} \frac{V_i(t_2)}{R_i} - V_{g12}(t_2) \sum_{i=0}^{n} \frac{1}{R_i} - RI_{g12}(t_2) \sum_{i=0}^{n} \frac{1}{R_i} \qquad \text{Equation 17}$$

In this case, it is regarded that a location where leakage occurs and a leakage resistance do not vary during the detection irrespective of time. Since the location where leakage occurs does not vary even when the leakage detection switches $SW_1$ and $SW_2$ are switched, the following equation 18 is formulated.

In this case, it is assumed that leakage occurs in a sufficiently high leakage resistance value range. Irrespective of occurrence of leakage, an extent of leakage, in the case where a location leakage occurs does not vary, $V_i(t)$ at an arbitrary terminal location can be represented by a product of a later-discussed terminal voltage V-r(t) and a proportionality constant $K_i$. At timing $t_1$ and $t_2$, $V_i$ at the same terminal location and the terminal voltage $V_T$ may vary, but the proportionality constant $K_i$ does not vary. Accordingly, the following equation 18 is formulated.

$$V_i(t_1) = k_i(V_n(t_1) - V_a(t_1)) = k_i V_T(t_1)$$

$$V_i(t_2) = k_i(V_n(t_2) - V_a(t_2)) = k_i V_T(t_2)$$

$$(0 \leq k_i \leq 1) \qquad \text{Equation 18}$$

In this case, $V_T(t)$ represents a terminal voltage between the terminals of the both ends of the battery pack 10, I.e., a total voltage. Accordingly, since the batteries 11 are connected to each other in series, the foregoing equations 14 and 17 can be transformed to the following equations 19 and 20 by applying the foregoing equation 18. In this embodiment, the voltage detection means 200 detects the voltage $V_n(t)$ and $V_0(t)$, and the leakage calculator 40 calculates their difference, thus, the terminal voltage $V_T(t)$ can be obtained. That is, the terminal voltage $V_T(t)$ is detected by circuitry of the voltage detection means 200 and the leakage calculator 40. Instead of this circuitry, a circuit that directly measures the terminal voltage $V_T(t)$ may be provided and detect it to provide a detected value to the leakage calculator 40.

$$I_{g11}(t_1) = V_T(t_1) \sum_{i=0}^{n} \frac{k_i}{R_i} - V_{g11}(t_1) \sum_{i=0}^{n} \frac{1}{R_i} - R I_{g11}(t_1) \sum_{i=0}^{n} \frac{1}{R_i} \qquad \text{Equation 19}$$

$$I_{g12}(t_2) = V_T(t_2) \sum_{i=0}^{n} \frac{k_i}{R_i} - V_{g12}(t_2) \sum_{i=0}^{n} \frac{1}{R_i} - R I_{g12}(t_2) \sum_{i=0}^{n} \frac{1}{R_i} \qquad \text{Equation 20}$$

The foregoing equation 19 can be transformed to the following equation 21.

$$\sum_{i=0}^{n} \frac{k_i}{R_i} = \frac{I_{g11}(t_1) + V_{g11}(t_1) \sum_{i=0}^{n} \frac{1}{R_i} + R I_{g11}(t_1) \sum_{i=0}^{n} \frac{1}{R_i}}{V_T(t_1)} \qquad \text{Equation 21}$$

Substituting the equation 21 into the equation 20 provides the following equation 22.

$$\left( \sum_{i=0}^{n} \frac{1}{R_i} \right)^{-1} = \frac{\frac{V_{g11}(t_1)}{V_T(t_1)} - \frac{V_{g12}(t_2)}{V_T(t_2)}}{\frac{I_{g12}(t_2)}{V_T(t_2)} - \frac{I_{g11}(t_1)}{V_T(t_1)}} - R \qquad \text{Equation 22}$$

In this case, since the locations of $V_{g11}(t_1)$ and $V_{g12}(t_2)$ do not vary irrespective of the total voltages of $V_T(t_1)$ $V_T(t_2)$, the following equation 23 is formulated.

$$mV_T(t_1) = V_{g11}(t_1) - V_{g12}(t_1) \qquad \text{Equation 23}$$

$$mV_T(t_2) = V_{g11}(t_2) - V_{g12}(t_2)$$

$$(0 \leq m \leq 1)$$

$$\frac{V_{g12}(t_2)}{V_T(t_2)} = \frac{V_{g12}(t_1)}{V_T(t_1)} = \varepsilon$$

where $\varepsilon$ is a constant. As a result, the foregoing equation 22 can be further transformed to the following equation 24.

$$\left( \sum_{i=0}^{n} \frac{1}{R_i} \right)^{-1} = \frac{\frac{V_{g11}(t_1)}{V_T(t_1)} - \frac{V_{g12}(t_1)}{V_T(t_1)}}{\frac{I_{g12}(t_2)}{V_T(t_2)} - \frac{I_{g11}(t_1)}{V_T(t_1)}} - R \qquad \text{Equation 24}$$

$$= \frac{\frac{V_{g11}(t_1) - V_{g12}(t_1)}{V_T(t_1)}}{\frac{I_{g12}(t_2)}{V_T(t_2)} - \frac{I_{g11}(t_1)}{V_T(t_1)}} - R$$

$$= \frac{m \frac{V_{g11}(t_1) - V_{g12}(t_1)}{V_{g11}(t_1) - V_{g12}(t_1)}}{\frac{mI_{g12}(t_2)}{V_{g11}(t_2) - V_{g12}(t_2)} - \frac{mI_{g11}(t_1)}{V_{g11}(t_1) - V_{g12}(t_1)}} - R$$

In this case, the following equations 25 to 28 are formulated.

$$I_{g11}(t_1) = \frac{V_{l11}(t_1)}{R_a} \qquad \text{Equation 25}$$

$$I_{g12}(t_2) = \frac{V_{l12}(t_2)}{R_a} \qquad \text{Equation 26}$$

$$V_{g11}(t_1) - V_{g12}(t_1) = V_f(t_1) \qquad \text{Equation 27}$$

$$V_{g11}(t_2) - V_{g12}(t_2) = V_f(t_2) \qquad \text{Equation 28}$$

Accordingly, substituting the foregoing equations 25 to 28 into the equation 24 provides the following equation 29, that is, $R_l$ of the equation 10 can obtained, $$\left( \sum_{i=0}^{n} \frac{1}{R_i} \right)^{-1} = \frac{R_a}{\frac{V_{l12}(t_2)}{V_f(t_2)} - \frac{V_{l11}(t_1)}{V_f(t_1)}} - R \qquad \text{Equation 29}$$

As discussed above, the combined resistance value of the leakage resistances can be calculated. The leakage calculator 40 compares this calculated leakage resistance with a prescribed value. When it is smaller than the prescribed value, measures, such as warning sign, will be taken. On the other hand, in the case where leakage occurs at one location, it is possible to calculate not only the resistance value but also a portion where leakage occurs. In the case where it is assumed that leakage occurs at only a point l, if it is considered that leakage resistance values other than the point l are infinite, the following equation 30 is formulated.

$$R_0 = R_1 = R_{l-1} = R_{l+1} \ldots = R_{n-1} = R_n = \infty \qquad \text{Equation 30}$$

where $0 \leq l \leq n$

In this case, the foregoing equation 19 is transformed, and $I_{g11}(t_1)$ is calculated, thus, the following equation 31 is formulated.

$$I_{g11}(t_1) = \frac{V_T(t_1) \sum_{i=0}^{n} \frac{k_i}{R_i} - V_{g11}(t_1) \sum_{i=0}^{n} \frac{1}{R_i}}{1 + R \sum_{i=0}^{n} \frac{1}{R_i}} \qquad \text{Equation 31}$$

The equation 31 is substituted into the foregoing equation 9, thus, the following equation 32 is formulated.

$$V_{l11}(t_1) = R_a \cdot I_{g11}(t_1)$$

Equation 32

$$= R_a \cdot \frac{V_T(t_1) \sum_{i=0}^{n} \frac{k_i}{R_i} - V_{g11}(t_1) \sum_{i=0}^{n} \frac{1}{R_i}}{1 + R \sum_{i=0}^{n} \frac{1}{R_i}}$$

This equation is expanded where $1/\infty=0$ in consideration of the equation 30, thus, $k_l$ can be calculated by the following equation 33.

$$k_l = \frac{\frac{V_{l11}(t_1)}{R_a}(R_l + R) + V_{g11}(t_1)}{V_T(t_1)}$$

$$0 \leq k_l \leq 1$$

Equation 33

The denominator $V_T(t_1)$ of the above equation is $V_n(t_1) - V_0(t_1)$ based on the equation 18.

Accordingly, $R_l$ is calculated from the detected values based on the foregoing equation 29, thus, the value $k_l$ can be calculated from the above equation 33. As shown in the foregoing equation 18, the proportionality constant $K_l$ equals to the proportionality constant $K_l$ to be multiplied in the representation of the voltage $V_1(t)(=K_l V_T(t))$ at the battery terminal to which the leakage resistance $R_l$ is connected. As a result, this proportionality constant $K_l$ represents the location of the battery terminal to which the leakage resistance $R_l$ is connected, thus, it is possible to detect a portion where leakage occurs based on this value. Although the aforementioned method can correctly calculate $k_l$ in the case where leakage occurs at one location, it is difficult to detect a portion where leakage occurs in the case where it occurs at two or more locations. However, even in this case, the combined value of the leakage resistances of the whole circuit can be calculated based on the foregoing equation 29.

The leakage calculator 40 calculates $k_l$ that represents the leakage resistance $R_l$ and a portion where leakage occurs, and transmits the calculation result for other processes if necessary, or the display portion displays it. In this method, information about leakage can be obtained only by calculation based on the detected values at two points in time. Therefore, it is possible to provide excellent features that can grasps leakage very easily, and can apply this method to existing facilities without attaching special hardware.

The leakage detection circuit for an electric vehicle and the leakage detection method for an electric vehicle of the present invention can be preferably applied to electric cars and hybrid cars.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims or equivalence of such metes and bounds thereof are therefore intended to be embraced by the claims. This application is based on applications No. 2004-160344 filed in Japan on May 28, 2004, the content of which is incorporated hereinto by reference.

What is claimed is:

1. A battery leakage detection circuit for an electric vehicle comprising:
   a battery pack including a plurality of batteries that are connected to each other in series;
   leakage detection resistances $R_a$ and $R_b$ that are connected in series between a ground, and each of battery terminals of the batteries at two arbitrary locations in the high and low voltage sides;
   voltage detecting means that detects voltages of the battery terminals in the high and low voltage sides as $V_{g11}(t)$ and $V_{g12}(t)$, respectively, at timing t;
   leakage detection switches $SW_1$ and $SW_2$ each of which is connected in series between the leakage detection resistances $R_a$ and $R_b$;
   a voltage detector that detects a voltage $V_{l11}(t)$ produced in the leakage detection resistance $R_a$ connected to the leakage detection switch $SW_1$, when one leakage detection switch $SW_1$ connected to the battery terminal in the high voltage side is closed at timing t and the other leakage detection switch $SW_2$ is opened, and detects a voltage $V_{l12}(t)$ produced in the leakage detection resistance $R_a$ connected to the leakage detection switch $SW_2$, when the other leakage detection switch $SW_2$ connected to the battery terminal in the low voltage side is closed at timing t and the one leakage detection switch $SW_1$ is opened, and
   a leakage calculator that calculates a combined value $R_l$ of the leakage resistances based on the following equation 1

$$R_l = \frac{R_a}{\frac{V_{l12}(t_2)}{V_{g11}(t_2) - V_{g12}(t_2)} - \frac{V_{l11}(t_1)}{V_{g11}(t_1) - V_{g12}(t_1)}} - (R_a + R_b)$$

Equation 1 where $t_1$ and $t_2$ are different time values.

2. The battery leakage detection circuit for an electric vehicle according to claim 1, wherein the circuit further comprises a measurer that measures a terminal voltage $V_T(t)$ between the both ends of the battery pack at timing t, wherein
   in the case where leakage occurs at one of the locations, at timing t, where $V_l(t)$ is the voltage of the battery terminal in which the leakage occurs, and this voltage is represented by $K_l V_T(t)$ by using the terminal voltage $V_T(t)$ and a proportionality constant $K_l$, the leakage calculator calculates $k_l$ based on the following equation 2 and estimates the leakage portion based on $k_l$ $$k_l = \frac{\frac{V_{l11}(t_1)}{R_a}(R_l + R_a + R_b) + V_{g11}(t_1)}{V_T(t_1)}$$

$$0 \leq k_l \leq 1$$

Equation 2

3. The battery leakage detection circuit for an electric vehicle according to claim 1, wherein the resistance values of the leakage detection resistances $R_a$ and $R_b$ equal to each other.

4. The battery leakage detection circuit for an electric vehicle according to claim 1, wherein the electric vehicle is a hybrid car or an electric car.

5. A leakage detection method for an electric vehicle that detects leakage of a battery pack for the electric vehicle comprising steps of:

in a battery leakage detection circuit including leakage detection resistances $R_a$ and $R_b$, the leakage detection resistances $R_a$ and $R_b$ being connected in series between a ground, and each of battery terminals of the batteries that are connected to each other in series at two arbitrary locations in the high and low voltage sides in a plurality of batteries composing the battery pack, and leakage detection switches $SW_1$ and $SW_2$ each of which is connected in series between the leakage detection resistances $R_a$ and $R_b$, detecting a voltage $V_{l11}(t)$ produced in the leakage detection resistance $R_a$, when one leakage detection switch $SW_1$ connected to the battery terminal in the high voltage side is closed at timing t and the other leakage detection switch $SW_2$ is opened;

detecting a voltage $V_{l12}(t)$ produced in the leakage detection resistance $R_a$, when the other leakage detection switch $SW_2$ connected to the battery terminal in the low voltage side is closed at timing t and the one leakage detection switch $SW_1$ is opened;

detecting voltages of the battery terminals in the high and low voltage sides as $V_{g11}(t)$ and $V_{g12}(t)$, respectively; and calculating a combined value $R_l$ of the leakage detection resistances by using the values detected in the foregoing steps based on the following equation 3

$$R_l = \frac{R_a}{\frac{V_{l12}(t_2)}{V_{g11}(t_2) - V_{g12}(t_2)} - \frac{V_{l11}(t_1)}{V_{g11}(t_1) - V_{g12}(t_1)}} - (R_a + R_b) \qquad \text{Equation 3}$$

where $t_1$ and $t_2$ are different time values.

6. The leakage detection method for an electric vehicle according to claim 5, wherein the method further comprising steps of measuring a terminal voltage $V_T(t)$ between the both ends of the battery pack at timing $t_1$ and estimating, in the case where leakage occurs at one of the locations, at timing t, where $V_l(t)$ is the voltage of the battery terminal in which the leakage occurs and this voltage is represented by $K_l V_T(t)$ by using the terminal voltage $V_T(t)$ and a proportionality constant $K_l$, the leakage portion based on $k_l$ by calculating $k_l$ based on the following equation 4

$$k_l = \frac{\frac{V_{l11}(t_1)}{R_a}(R_l + R_a + R_b) + V_{g11}(t_1)}{V_T(t_1)} \qquad \text{Equation 4}$$

$$0 \le k_l \le 1$$

7. The leakage detection method for an electric vehicle according to claim 5, wherein the resistance values of the leakage detection resistances $R_a$ and $R_b$ equal to each other.

8. The leakage detection method for an electric vehicle according to claim 5, wherein the electric vehicle is a hybrid car or an electric car.

* * * * *